(12) United States Patent
Boyama et al.

(10) Patent No.: US 10,096,646 B2
(45) Date of Patent: Oct. 9, 2018

(54) LIGHT-EMITTING UNIT

(71) Applicant: TOYODA GOSEI CO., LTD., Kiyosu-shi (JP)

(72) Inventors: Misato Boyama, Kiyosu (JP); Shingo Totani, Kiyosu (JP); Takashi Kawai, Kiyosu (JP); Yoshiki Saito, Kiyosu (JP); Naoyuki Okita, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 63 days.

(21) Appl. No.: 15/261,495

(22) Filed: Sep. 9, 2016

(65) Prior Publication Data
US 2017/0077173 A1  Mar. 16, 2017

(30) Foreign Application Priority Data
Sep. 15, 2015  (JP) ................. 2015-182012

(51) Int. Cl.
*H01L 33/24* (2010.01)
*H01L 27/15* (2006.01)
*H01L 33/32* (2010.01)
*H01L 33/38* (2010.01)
*H01L 33/62* (2010.01)

(52) U.S. Cl.
CPC ............ *H01L 27/156* (2013.01); *H01L 33/24* (2013.01); *H01L 33/32* (2013.01); *H01L 33/38* (2013.01); *H01L 33/62* (2013.01)

(58) Field of Classification Search
CPC ......... H01L 33/62; H01L 33/24; H01L 33/32; H01L 33/38; H01L 27/156; H01L 33/0062
See application file for complete search history.

(56) References Cited

U.S. PATENT DOCUMENTS 6,191,439 B1 *  2/2001  Sugawara ............... H01L 33/14
                                                                257/103
8,471,288 B2 *  6/2013  Uemura .................. H01L 33/38
                                                                257/103
(Continued)

FOREIGN PATENT DOCUMENTS

JP    2002-314130 A    10/2002
JP    2004-055567 A    2/2004
(Continued)

OTHER PUBLICATIONS

Japanese Office Action dated Jul. 3, 2018, with an English translation.

*Primary Examiner* — Daniel Luke
*Assistant Examiner* — Khatib Rahman
(74) *Attorney, Agent, or Firm* — McGinn IP Law Group, PLLC

(57) ABSTRACT

To provide a light-emitting unit having a semiconductor light-emitting device with a good responsiveness and a sufficient light emission quantity. The light-emitting unit comprises a plurality of semiconductor light-emitting devices, an n-wiring electrode and a p-wiring electrode respectively connecting the semiconductor light-emitting devices in parallel, an n-pad electrode connected to the n-wiring electrode, and a p-pad electrode connected to the p-wiring electrode. At least one of the Group III nitride semiconductor light-emitting devices has a light emission volume of 1 $\mu m^3$ to 14 $\mu m^3$.

15 Claims, 5 Drawing Sheets

(56) References Cited

U.S. PATENT DOCUMENTS

| | | | |
|---|---|---|---|
| 8,816,322 B2* | 8/2014 | Okuno | H01L 33/12 |
| | | | 257/103 |
| 8,927,962 B2* | 1/2015 | Ueno | B82Y 20/00 |
| | | | 257/14 |
| 9,281,449 B2 | 3/2016 | Kim et al. | |
| 9,515,228 B2* | 12/2016 | Totani | H01L 33/382 |
| 9,601,666 B2 | 3/2017 | Kim et al. | |
| 2007/0246736 A1 | 10/2007 | Senda et al. | |
| 2014/0131657 A1 | 5/2014 | Kim et al. | |
| 2016/0027978 A1* | 1/2016 | Shih | H01L 33/382 |
| | | | 257/13 |
| 2016/0225954 A1 | 8/2016 | Kim et al. | |
| 2016/0372631 A1* | 12/2016 | Hasegawa | H01L 33/18 |

FOREIGN PATENT DOCUMENTS

| | | |
|---|---|---|
| JP | 2007-234672 A | 9/2007 |
| JP | 2007-305965 A | 11/2007 |
| JP | 2014-096591 A | 5/2014 |

\* cited by examiner

LIGHT-EMITTING UNIT

BACKGROUND OF THE INVENTION

Field of the Invention

The present invention relates to a light-emitting unit having Group III nitride semiconductor light-emitting devices.

Background Art

Semiconductor light-emitting devices have been applied to the field of optical communication or optical information processing using optical fiber module in addition to illumination use. When the semiconductor light-emitting device is applied to optical communication or the like, the light-emitting device is desired to have a good responsiveness after the power is turned on until the light is emitted, and a high light output.

Thus, there have been developed semiconductor light-emitting devices having a good responsiveness. For example, Japanese Patent Application Laid-Open (kokai) No. 2002-314130 discloses a light-emitting diode which uniformly emits light even when the light emitting area is very small. An electrode material is selected so that the ohmic characteristics of the transparent electrode for the p-type semiconductor layer are superior to the ohmic characteristics of the p-side diffusion electrode for the p-type semiconductor layer (refer to paragraphs [0007], [0028] to [0029]).

However, the light emission quantity tends to be insufficient when the light emitting area is very small as described above. Recently, a light emitting-device having more remarkable responsiveness is expected.

SUMMARY OF THE INVENTION

The present invention has been conceived for solving the aforementioned problems involved in conventional techniques. The present inventors discover that when a total emission area is constant, a response time is shorter in a light-emitting device which has parallel connection of smaller emission areas than in a light-emitting device having one larger emission area. Thus, an object of the present invention is to provide a light-emitting unit having a semiconductor light-emitting device with a good responsiveness and a high light emission quantity.

In a first aspect of the present invention, there is provided a light-emitting unit comprising a substrate; an n-type layer comprising Group III nitride semiconductor; a light-emitting layer comprising Group III nitride semiconductor; a p-type layer comprising Group III nitride semiconductor; an isolation groove electrically separating the n-type layer, the light-emitting layer comprising a well layer, and the p-type layer into a plurality of light-emitting devices on the substrate; an n-wiring electrode connecting the respective n-type layers of the respective light-emitting devices in parallel; a p-wiring electrode connected to the respective p-type layers of the respective light-emitting devices in parallel; an n-pad electrode connected to the n-wiring electrode; and a p-pad electrode connected to the p-wiring electrode; wherein each of the light-emitting devices has a light emission volume of 1 $\mu m^3$ to 14 $\mu m^3$, the light emission volume being defined as a total volume of the well layer effectively contributing to emit a light.

Since the light-emitting unit is electrically separated into a plurality of light-emitting devices on the substrate, the light emission volume of each of the light-emitting devices is small enough. Therefore, the response time of the light-emitting unit is short enough. The response time of the light-emitting unit is, for example, 3 nsec to 11 nsec.

Since the semiconductor light-emitting devices are connected in parallel, the light-emitting unit has a good responsiveness. The light-emitting unit can obtain a high light emission quantity.

In a first aspect of the present invention, the light emission volume may be 1 $\mu m^3$ to 10 $\mu m^3$ or 1.2 $\mu m^3$ to 8.9 $\mu m^3$. Moreover, the effective light emission area of each light-emitting device is preferably 1000 $\mu m^2$ to 2400 $\mu m^2$. The light-emitting layer comprises a well layer and a barrier layer. The thickness of the well layer may be 1 nm to 10 nm or 1.2 nm to 3.7 nm. The thickness of the barrier layer may be 1 nm to 5 nm.

A second aspect of the invention is directed to a specific embodiment of the light-emitting unit, wherein the substrate has a rectangular shape, a number of the light-emitting devices is four, and the n-pad electrode and the p-pad electrode are disposed on a diagonal line of the rectangular shape.

The present invention, disclosed in the specification, provide a light-emitting unit having a semiconductor light-emitting device with a good responsiveness and a high light emission quantity.

BRIEF DESCRIPTION OF THE DRAWINGS

Various other objects, features, and many of the attendant advantages of the present invention will be readily appreciated as the same becomes better understood with reference to the following detailed description of the preferred embodiment when considered in connection with the accompanying drawings, in which.

DETAILED DESCRIPTION OF PREFERRED EMBODIMENT

Figure 1:
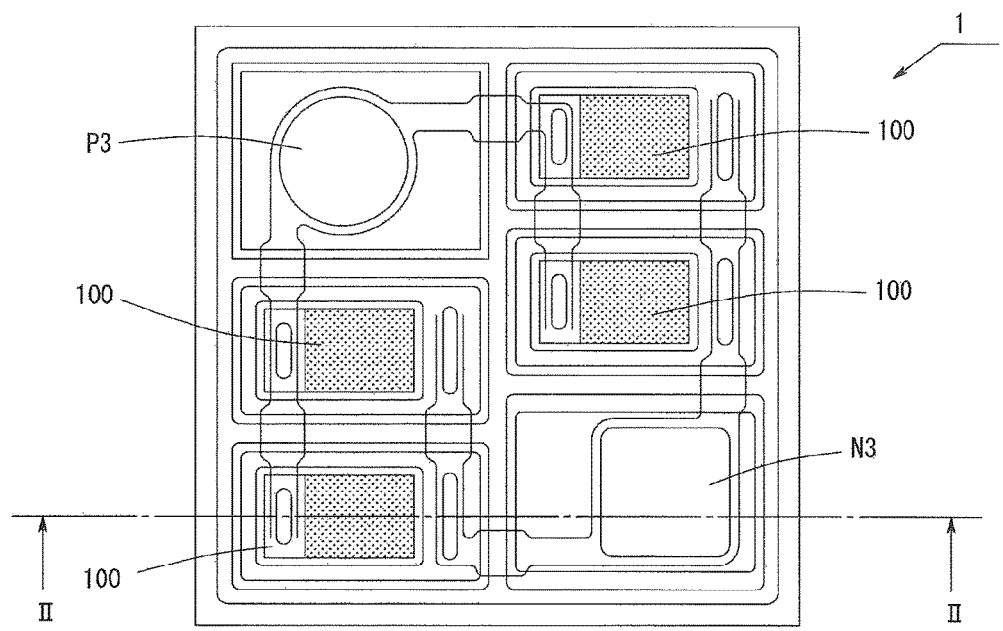
FIG. 1 is a plan view showing a light-emitting unit according to an Embodiment (part 1)

With reference to the drawings, specific embodiment of a light-emitting unit as an example will next be described in detail. However, this embodiment should not be construed as limiting the invention thereto. The below-described deposition structure of the layers of the light-emitting unit and the electrode structure are given only for the illustration purpose, and other deposition structures differing therefrom may also be employed. The thickness of each of the layers shown in the drawings is not an actual value, but a conceptual value.

1. Light-Emitting Unit

Figure 2:
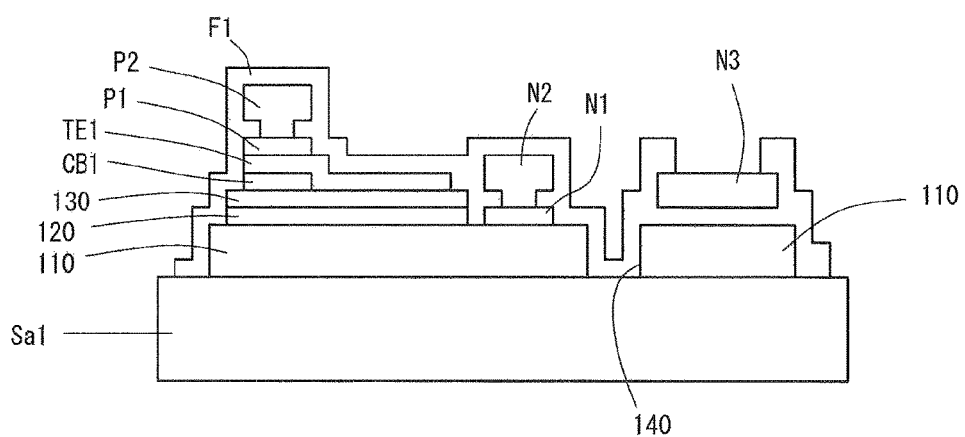
FIG. 2 is an II-II cross-sectional view of FIG. 1.
Figure 3:
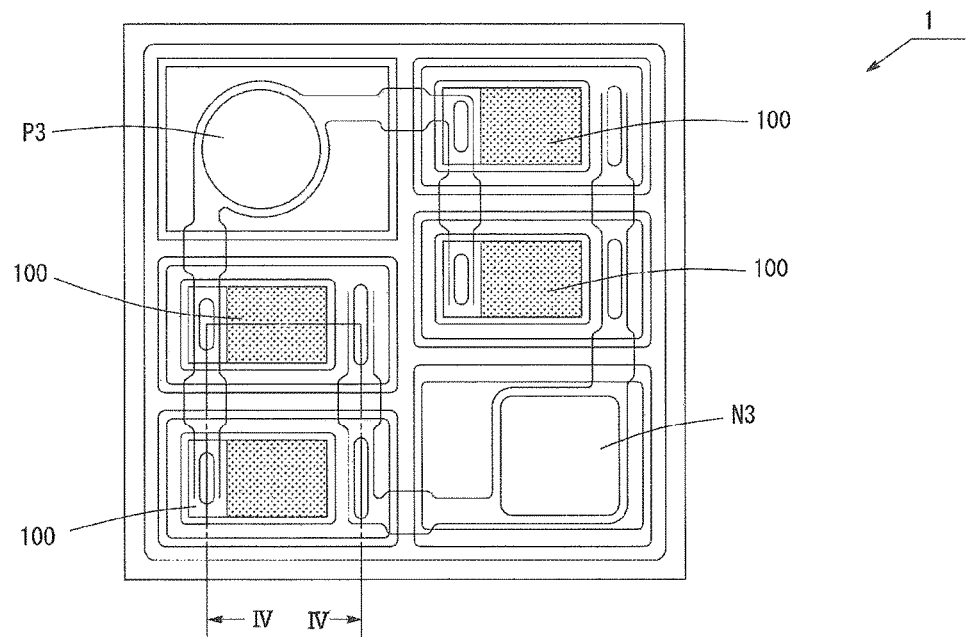
FIG. 3 is a plan view showing a light-emitting unit according to an Embodiment (part 2)
Figure 4:
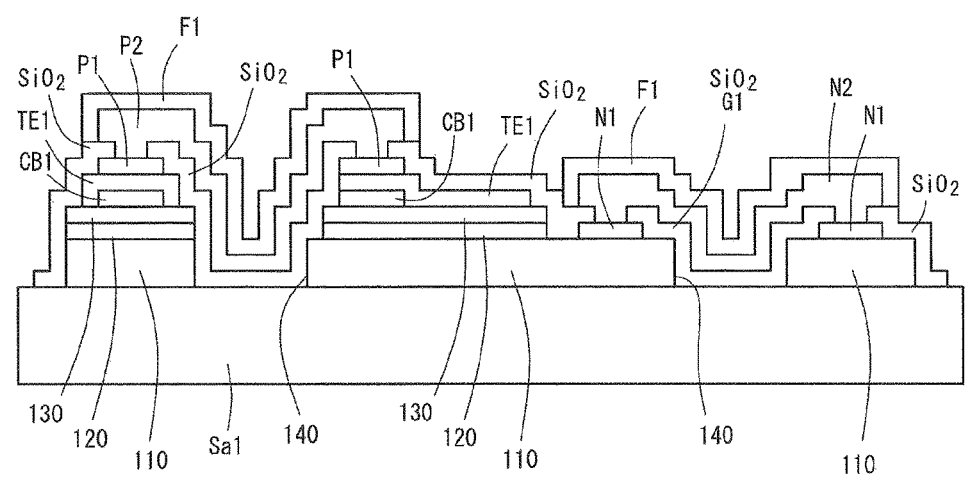
FIG. 4 is an IV-IV cross sectional view of FIG. 3.

FIG. 1 is a plan view showing a light-emitting unit 1 according to the Embodiment. FIG. 2 is an II-II cross-sectional view of FIG. 1. FIG. 4 is an IV-IV cross-sectional view of the light-emitting unit 1 in a plan view of FIG. 3 as same as FIG. 1. The light-emitting unit 1 serves to make light incident into an optical cable. The inside diameter of the optical cable is, for example, about 1 mm. Therefore, the length of one side of the light-emitting unit 1 is, for example, 2 mm or less. The light-emitting unit 1 is monolithic. The light-emitting unit 1 has a plurality of semiconductor light-emitting devices 100 on one substrate. In the light-emitting unit 1, four semiconductor light-emitting devices 100 are formed on one substrate Sa1. Each of the semiconductor light-emitting devices 100, is a face-up type Group III nitride semiconductor light-emitting device. The emission wavelength of the semiconductor light-emitting device 100 is, for example, within a range of 500 nm to 530 nm.

As described above, the light-emitting unit 1 has four semiconductor light-emitting devices 100. These four semiconductor light-emitting devices 100 are connected in parallel each other. Therefore, these semiconductor light-emitting devices 100 start to emit light at almost the same time when the power is turned on. That is, the light-emitting unit 1 has a good responsiveness. Since four semiconductor light-emitting devices 100 are connected in parallel, the light-emitting unit 1 is bright enough.

As shown in FIGS. 1 to 4, the light-emitting unit 1 comprises a substrate Sa1, an n-type semiconductor layer 110, a light-emitting layer 120, a p-type semiconductor layer 130, a current blocking layer CB1, a transparent electrode TE1, an n-contact electrode N1, an n-wiring electrode N2, an n-pad electrode N3, a p-contact electrode P1, a p-wiring electrode P2, a p-pad electrode P3, an insulation film G1 and a dielectric protective film F1. In FIG. 2, the regions where the dielectric protective film F1 is deposited on the insulation film G1 are simply shown by symbol F1. In FIG. 4, the insulation film G1 made of $SiO_2$ is shown.

The n-wiring electrode N2 and the p-wiring electrode P2 respectively connect four semiconductor light-emitting devices 100 in parallel. In other words, one n-wiring electrode N2 and one p-wiring electrode P2 are formed for the light-emitting unit 1. The n-wiring electrode N2 is one line bent in right angle at two corners and the p-wiring electrode P2 is one line bent in right angle at two corners. Corresponding linear areas of the n-wiring electrode N2 and the p-wiring electrode P2 are parallel at the both sides of the respective light-emitting devices 100.

Moreover, one n-pad electrode N3 and one p-pad electrode P3 are formed for the light-emitting unit 1.

The substrate Sa1 is a support substrate for supporting the semiconductor light-emitting devices 100. Therefore, four semiconductor light-emitting devices 100 are formed on one substrate Sa1. The substrate Sa1 may also serve as a growth substrate. The substrate Sa1 preferably has irregularities on the main surface thereof. The substrate Sa1 is made of sapphire. Other than sapphire, a material such as SiC, $ScAlMgO_4$(SCAM), ZnO, Si, and GaN may be employed.

Each of the n-type semiconductor layer 110, the light-emitting layer 120, and the p-type semiconductor layer 130 are semiconductor layers formed on the substrate Sa1. The n-type semiconductor layer 110 has an n-type contact layer, an n-side electrostatic breakdown-preventing layer, and an n-side superlattice layer. The n-type semiconductor layer 110 may have an ud-GaN layer and others undoped with a donor. The p-type semiconductor layer 130 has a p-side cladding layer and a p-type contact layer. The p-type semiconductor layer 130 may have an ud-GaN layer and others undoped with an acceptor. The n-type semiconductor layer 110 and the p-type semiconductor layer 130 may have a structure other than the above.

The current blocking layer CB1 is a layer for diffusing the current over a light-emitting surface as well as preventing the current from flowing just below the electrode. The current blocking layer CB1 is formed between the p-type semiconductor layer 130 and the transparent electrode TE1. The transparent electrode TE1 is formed on the p-type semiconductor layer 130 and the current blocking layer CB1. The transparent electrode TE1 is made of transparent conductive oxide. The material of the transparent electrode TE1 includes ITO, IZO, ICO, ZnO, $TiO_2$, $NbTiO_2$, $TaTiO_2$, and $SnO_2$. Other transparent oxide may be used.

The dielectric protective film F1 covers at least a part of the semiconductor layer and the transparent electrode TE1. The dielectric protective film F1 also covers the n-wiring electrode N2 and the p-wiring electrode P2. The dielectric protective film F1 is made of, for example, $SiO_2$.

The n-contact electrode N1 is an electrode that comes into contact with the n-type contact layer of the n-type semiconductor layer 110. The n-wiring electrode N2 is an electrode for electrically connecting a plurality of n-contact electrodes N1 and the n-pad electrodes N3. The n-wiring electrode N2 electrically connects the n-contact electrodes N1 of four semiconductor light-emitting devices 100. Therefore, the n-wiring electrode N2 is a linear electrode extending like branches. For example, the n-wiring electrode N2 is a comb-shaped electrode. The n-pad electrode N3 is an electrode that is electrically connected to an external power source.

The p-contact electrode P1 is an electrode that comes into contact with the p-type contact layer of the p-type semiconductor layer 130. The p-wiring electrode P2 is an electrode for electrically connecting a plurality of p-contact electrodes P1 and the p-pad electrode P3. The p-wiring electrode P2 electrically connects the p-contact electrodes P1 of four semiconductor light-emitting devices 100. Therefore, the p-wiring electrode P2 is a linear electrode extending like branches. For example, the p-wiring electrode P2 is a comb-shaped electrode. The p-pad electrode P3 is an electrode that is electrically connected to an external power source.

The deposition structures of semiconductor and electrode are merely examples. Therefore, the semiconductor and the electrode may have a deposition structure other than the above.

2. Structure of Light-Emitting Layer

Figure 5:
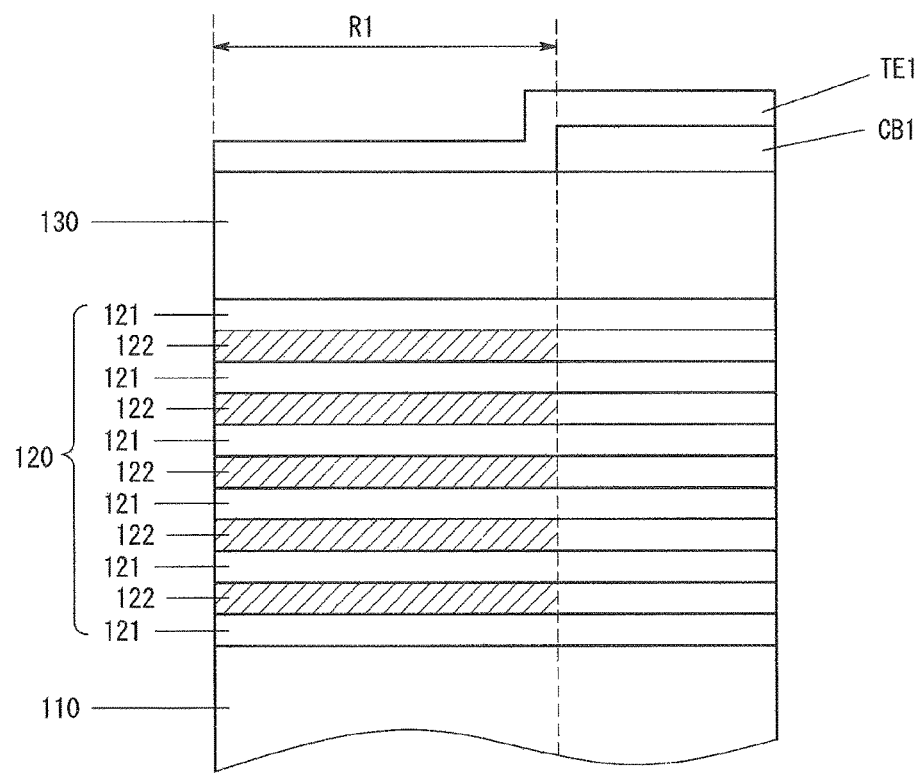
FIG. 5 is a schematic view illustrating a deposition structure of a light-emitting layer of a semiconductor light-emitting device according to an Embodiment.

FIG. 5 is a schematic view illustrating the light-emitting layer 120 and its surrounding according to the Embodiment. The light-emitting layer 120 comprises a barrier layer 121 and a well layer 122. The barrier layer 121 and the well layer 122 are alternately and repeatedly formed. That is, the light-emitting layer is a multiple quantum well layer (MQW). In FIG. 5, the light-emitting layer 120 has five well layers 122. This is merely an example. The number of the well layer 122 may be other value.

The well layer 122 is an InGaN layer. The In composition ratio of the well layer 122 is 0.1 to 0.4. The thickness of the well layer 122 is, for example, 1 nm to 10 nm. The barrier layer 121 is an undoped AlGaN layer. The Al composition ratio of the barrier layer 121 is 0.1 to 0.3. The thickness of the barrier layer 121 is, for example, 1 nm to 5 nm, and preferably, 1 nm to 2 nm.

3. Light Emission Volume
3-1. Definition of Light Emission Volume

In this Embodiment, the light emission volume is a desired value. The light emission volume refers to a total volume of layers which actually emit light of the well layers 122 in the light-emitting layer 120. That is, the light emission volume is obtained by multiplying an area of a first surface R1 where the p-type semiconductor layer 130 is in direct contact with the transparent electrode TE1 by a total thickness of the well layers 122 included when the first surface R1 is projected on the substrate Sa1.

In FIG. 5, the region of light emission volume is marked with slashed hatching. The region just below the current blocking layer CB1 is considered not to emit light. Therefore, the area excluding the area of the current blocking layer CB1 from the total area of the transparent electrode TE1 is the first region R1.

Thus, the light emission volume is expressed in the following formula.

$$V1 = S1 \times T1 \times C1 \qquad (1)$$

V1: Light emission volume
S1: Effective light emission area (area of first surface R1)
T1: Thickness of one well layer in light-emitting layer
C1: Number of repetitions of the well layer in the light-emitting layer $T1 \times C1$ is a total thickness of all the well layers in the light-emitting layer. Therefore, $S1 \times T1 \times C1$ is a total volume of all the well layers effectively contributing to emit a light. The effective light emission area S1 means the area where current flows in the well layer and the recombination of electrons and holes occurs to emit a light.

3-2. Definition of Response Time

Figure 6:
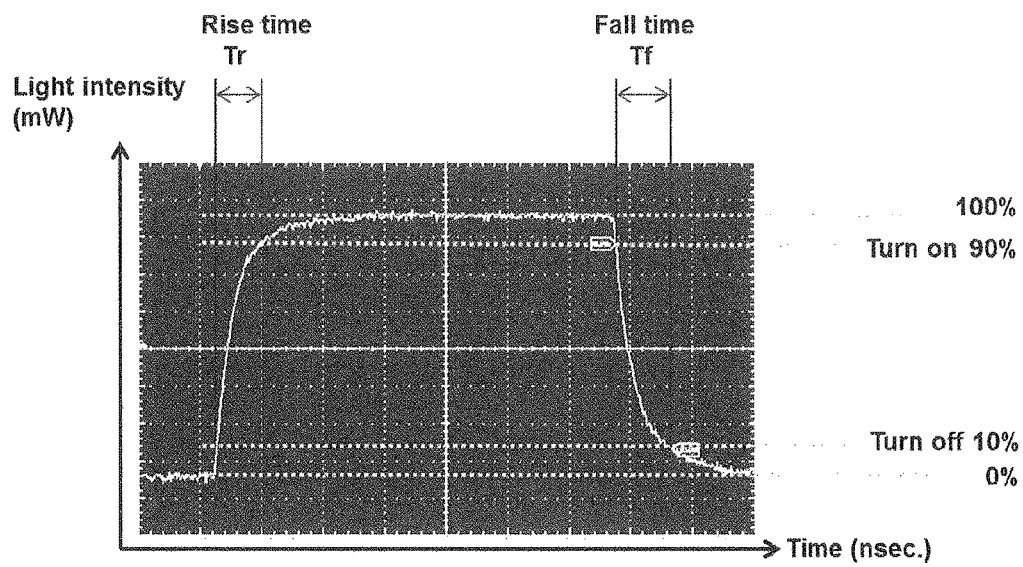
FIG. 6 is a graph showing the definition of response time.

FIG. 6 is a graph showing the response time. As shown in FIG. 6, the output is defined as 100% when the light intensity of the semiconductor light-emitting device 100 is stable. The rise time Tr is the time taken for the output to change from 10% to 90%. The fall time Tf is the time taken for the output to change from 90% to 10%. The response time is a sum of the rise time Tr and the fall time Tf.

3-3. Relationship Between Light Emission Volume and Response Time

As described later, there is a correlation between the response time and the light emission volume of the semiconductor light-emitting device 100. In this Embodiment, the light emission volume of the semiconductor light-emitting device 100 is in a range of 1 $\mu m^3$ to 14 $\mu m^3$. At this time, the response time of the semiconductor light-emitting device 100 is in a range of 3 nsec to 11 nsec. When the light emission volume is 1 $\mu m^3$ to 10 $\mu m^3$, the response time is 3 nsec to 8 nsec. When the light emission volume is 10 $\mu m^3$ to 14 $\mu m^3$, the response time is 8 nsec to 11 nsec.

Thus, there is a correlation between the light emission volume and the response time. The reason is as follows. When the InGaN well layer 122 is formed and the barrier layer 121 having a larger bandgap than that of the well layer is formed, strain is applied to the light-emitting layer 120, thereby generating an electric field. Electrons and holes are spatially separated. Therefore, the carrier density inside the light-emitting layer is increased by reducing the effective light emission area or the number of repetitions of the light-emitting layer 120. As a result, the influence of the electric fields inside the light-emitting layer 120 is shielded. Moreover, a distance between electrons and holes becomes shorter by reducing the thickness of the well layer 122 of the light-emitting layer 120. From the above mechanism, the smaller the light emission volume, the shorter the response time.

4. Method for Producing a Light-Emitting Unit 4-1. Semiconductor Layer Formation Step On a substrate Sa1, an n-type semiconductor layer 110, a light-emitting layer 120, and p-type semiconductor layer 130 are formed. The substrate Sa1 has a square shape of 350 µm×350 µm. More specifically, on a substrate Sa1, semiconductor layers; an n-type contact layer, an n-side electrostatic breakdown-preventing layer, an n-side superlattice layer, a light-emitting layer, a p-side cladding layer, and a p-type contact layer are sequentially formed. The semiconductor layers in the form of crystalline layers are epitaxially formed through metal-organic chemical vapor deposition (MOCVD). The carrier gas employed in the growth of semiconductor layers is hydrogen ($H_2$), nitrogen ($N_2$), or a mixture of hydrogen and nitrogen ($H_2+N_2$). Ammonia gas ($NH_3$) is used as a nitrogen source. trimethylgallium (Ga($CH_3)_3$) is used as a Ga source. trimethylindium (In($CH_3)_3$) is used as an In source, and trimethylaluminum (Al($CH_3)_3$) is used as an Al source. Silane ($SiH_4$) is used as an n-type dopant gas, and bis(cyclopentadienyl)magnesium (Mg($C_5H_5)_2$) is used as a p-type dopant gas. Needless to say, gases other than the above may also be used.

4-2. Current Blocking Layer Formation Step

Subsequently, a current blocking layer CB1 is formed on the p-type contact layer of the p-type semiconductor layer 130. The current blocking layer CB1 is made of, for example, $SiO_2$. The current blocking layer CB1 may be formed through CVD. The current blocking layer CB1 has a film thickness of, for example, 100 nm. Patterning of the current-blocking layer CB1 at a desired position and to a desired shape may be performed through photolithography.

4-3. Transparent Electrode Formation Step

Next, on the current blocking layer CB1 and the p-type contact layer, a transparent electrode TE1 is formed. In an example, an IZO film is formed through sputtering. The transparent electrode TE1 has a thickness of, for example, 70 nm. The transparent electrode TE1 is then subjected to a thermal treatment in an atmosphere at 650° C.

4-4. n-Type Semiconductor Layer Exposing Step

Subsequently, a part of the p-type semiconductor layer 130 and a part of the light-emitting layer 120 are removed by means of ICP, whereby a part of the n-type semiconductor layer 110 is exposed.

4-5. Isolation Groove Formation Step

An isolation groove 140 is formed by etching the p-type semiconductor layer 130 being the top layer, the light-emitting layer 120, and the n-type semiconductor layer 110. The top surface of the substrate is exposed in the bottom of the isolation groove 140. The isolation groove 140 is formed in a lattice pattern. The light-emitting unit is electrically separated into six rectangular regions of four rectangular light-emitting devices 100, one p-pad electrode P3, and one N-pad electrode N3.

4-6. Dot Electrode Formation Step

An insulation film G1 made of $SiO_2$ is uniformly formed on the top surface of the light-emitting unit 1 as shown as FIG. 4. The side surfaces of each light-emitting device 100 and the bottom surface of the isolation groove 140 are covered with the insulation film G1. Contact holes are formed in the insulation film G1. Then, n-contact electrodes N1 and p-contact electrodes P1 are formed in the holes. In one mode, Ni (50 nm), Au (1500 nm), and Al (10 nm) are sequentially formed through a vapor deposition technique. Then, a thermal treatment is carried out at 550° C. under oxygen. The pressure at the thermal treatment is, for example, 15 Pa.

4-7. Wiring Electrode Formation Step

Subsequently, an n-wiring electrode N2 and a p-wiring electrode P2 are formed on the insulation film G1. In one mode, Ti (50 nm), Au (15,000 nm), and Al (100 nm) are sequentially formed through a vapor deposition technique.

Notably, the n-type pad electrode NE and the p-type pad electrode PE may be formed separately.

4-8. Protective Film Formation Step

Next, a dielectric protective film F1 is formed on the top surface of the light-emitting unit 1. The semiconductor layers, the transparent electrode TE1, the p-wiring electrode P2, the n-wiring electrode N2 and the insulation film G1 are covered with the dielectric protective film F1. In one mode, the dielectric protective film F1 is formed of $SiO_2$ through CVD so as to have a film thickness of, for example, 100 nm.

4-9. Opening Formation Step

Subsequently, a part of the dielectric protective film F1 is opened by wet etching. Thereby, the dielectric film F1 is removed and a part of the p-wiring electrode P2 and a part of the n-wiring electrode N2 are exposed. These exposed portions respectively become a p-pad electrode P3 and an n-pad electrode N3.

4-10. Wafer Division Step

Next, a product wafer is cut into a large number of light-emitting units 1.

4-11. Other Steps

The production method may further include other steps such as a wiring step for providing each pad electrode with wiring. Notably, the mentioned production steps are provided as examples. Accordingly, the aforementioned deposition structures, numerical values, etc. are also given as examples. Needless to say, numerical values other than those given above may also be employed.

5. Variation 5-1. Number of Light-Emitting Devices

The light-emitting unit 1 according to the Embodiment has four semiconductor light-emitting devices 100 on one substrate Sa1. However, the number of semiconductor light-emitting devices 100 may be other number. The light-emitting unit 1 preferably has a plurality of semiconductor light-emitting devices 100 on one substrate Sa1.

5-2. Light-Emitting Unit

The light-emitting unit 1 according to the Embodiment has a plurality of semiconductor light-emitting devices 100 on one substrate Sa1. That is, the semiconductor light-emitting devices 100 are integrated into one via one common substrate Sa1. However, a nonmonolithic semiconductor light-emitting device may be employed. That is, separate semiconductor light-emitting devices are combined into one light-emitting unit.

5-3. Single Quantum Well Layer

The light-emitting layer 120 according to the Embodiment has a multiple quantum well layer (MQW). However, alternatively, it may have a single quantum well layer (SQW). In that case, the number of repetitions (C1) of the well layers in the light-emitting layer is 1 in the above formula (1).

5-4. Flip-Chip Type

The semiconductor light-emitting device 100 according to the Embodiment is of a face-up type. However, the present invention may also be applied to a flip-chip type semiconductor light-emitting device.

5-5. Wiring Electrode

The light-emitting unit 1 according to the Embodiment has the n-wiring electrode N2 and the p-wiring electrode P2. However, the present invention may also be applied to a light-emitting unit having no n-wiring electrode N2 or p-wiring electrode P2.

6. Summary of the Embodiment

As described above, in the light-emitting unit 1 of the Embodiment, a plurality of semiconductor light-emitting devices is connected in parallel and mounted. The light emission volume of the light-emitting unit 1 is 1 $\mu m^3$ to 14 $\mu m^3$. Therefore, the light-emitting unit 1 responds in a response time of 10 nsec or less. Moreover, the light-emitting unit 1 has a sufficient light intensity.

Notably, the aforementioned embodiments are given for the illustration purpose. Thus, needless to say, various modifications and variations can be made, so long as they fall within the scope of the present invention. No particular limitation is imposed on the deposition structure of the layer structure, and any deposition structure other than those described above may be employed. For example, the deposition structure, the number of repetitions of layer sets, etc. may be chosen without any limitation. The film formation technique is not limited to metal-organic chemical vapor deposition (MOCVD). Other similar invention may be employed, so long as they employ carrier gas in crystal growth. Alternatively, the semiconductor layers may be formed through another epitaxial growth technique such as liquid phase epitaxy or molecular beam epitaxy.

EXAMPLES

1. Sample Production

Samples were produced as follows. An AlN buffer layer, an n-type contact layer, an n-side electrostatic breakdown-preventing layer, an n-side superlattice layer, a light-emitting layer, a p-side cladding layer, and a p-type contact layer were sequentially formed on a sapphire substrate through MOCVD. The well layer of the light-emitting layer was an InGaN layer. The In composition ratio of the well layer was 0.25. The barrier layer of the light-emitting layer was an AlGaN layer. The Al composition ratio of the barrier layer was 0.08.

A $SiO_2$ current blocking layer CB1 was formed so as to have a thickness of 100 nm through CVD. The light-emitting layer has a SQW structure having only three layers of the barrier layer 121, the well layer 122 and the barrier layer 121 in FIG. 5. An IZO transparent electrode TE1 was formed so as to have a thickness of 70 nm by sputtering. An n-contact electrode N1 and a p-contact electrode P1 were formed. A $SiO_2$ dielectric film F1 was formed so as to have a thickness of 100 nm through CVD.

2. Measurement Results

Table 1 shows the measurement results of the response time of samples. Examples 1 to 8 and comparative examples 1 to 5 show the case where the well layer in the light-emitting layer is a single layer, i.e., SQW. In Examples 1 to 8, the light emission volume is 1 $\mu m^3$ to 14 $\mu m^3$. The response time, defined as a rise time Tr plus a fall time Tf, is about 10 nsec or less. In comparative examples 1 to 5, the light emission volume is 15 $\mu m^3$ or more. The response time is longer than about 10 nsec.

TABLE 1

| Sample | Effective light emission area ($\mu m^2$) | Thickness of well layer (nm) | Light emission volume ($\mu m^3$) | Response time (nsec) |
| --- | --- | --- | --- | --- |
| Example 1 | 1000 | 1.2 | 1.2 | 3.4 |
| Example 2 | 2400 | 1.2 | 2.9 | 3.6 |
| Example 3 | 4800 | 1.2 | 5.8 | 5.5 |
| Example 4 | 1000 | 1.7 | 1.7 | 4.1 |
| Example 5 | 2400 | 1.7 | 4.1 | 4.3 |
| Example 6 | 4800 | 1.7 | 8.2 | 5.8 |
| Example 7 | 1000 | 3.7 | 3.7 | 6.0 |
| Example 8 | 2400 | 3.7 | 8.9 | 8.0 |

TABLE 1-continued

| Sample | Effective light emission area (μm²) | Thickness of well layer (nm) | Light emission volume (μm³) | Response time (nsec) |
|---|---|---|---|---|
| Comparative Example 1 | 4800 | 3.7 | 17.8 | 11.3 |
| Comparative Example 2 | 83220 | 3.7 | 307.8 | 53.2 |
| Comparative Example 3 | 70680 | 3.7 | 261.5 | 43.9 |
| Comparative Example 4 | 111126 | 3.7 | 411.2 | 57.9 |
| Comparative Example 5 | 136742 | 3.7 | 505.9 | 76.3 |

Figure 7:
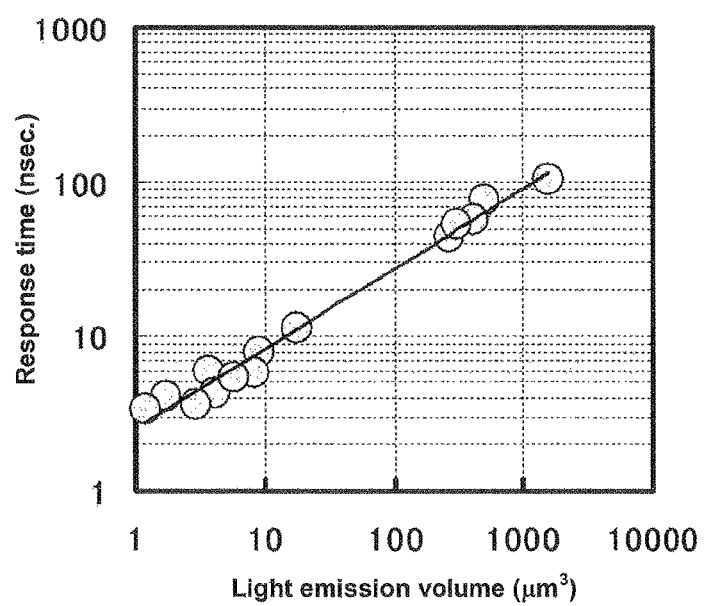
FIG. 7 is a graph showing the relationship between the light emission volume and the response time.

FIG. 7 is a graph showing the relationship of Table 1 between the light emission volume and the response time. The x-axis of FIG. 7 indicates the light emission volume of the semiconductor light-emitting device. The y-axis of FIG. 7 indicates the response time of the semiconductor light-emitting device. Samples with the effective light emission area (S1) and the thickness (T1) of the well layer varied were employed.

It is understood from the table 1 that when the effective light emission area (S1) is constant, the thinner the thickness (T1) of the well layer, the shorter the response time. Accordingly, it is expected that the response time depends on a product (T1×C1) of the thickness (T1) of the well layer and the number of repetitions (C1). And also it is understood from the table 1 that when the thickness (T1) of the well layer is constant, the smaller the effective light emission area (S1), the shorter the response time.

When the light emission volume is almost the same in a first sample having a large effective light emission area (S1) and a thin thickness (T1) of the well layer, and a second sample having a small effective light emission area (S1) and a thick thickness (T1) of the well layer, the response time is almost the same. That is, the response time mainly depends on the light emission volume (V1).

As shown in FIG. 7, the larger the light emission volume, the longer the response time. The smaller the light emission volume, the shorter the response time. When the light emission volume is 1,500 μm³, the response time is about 100 nsec. When the light emission volume is 1 μm³, the response time is about 3 nsec. When the light emission volume is 1 μm³ to 14 μm³, the response time of semiconductor light-emitting device is within a range of 3 nsec to 11 nsec.

Figure 8:
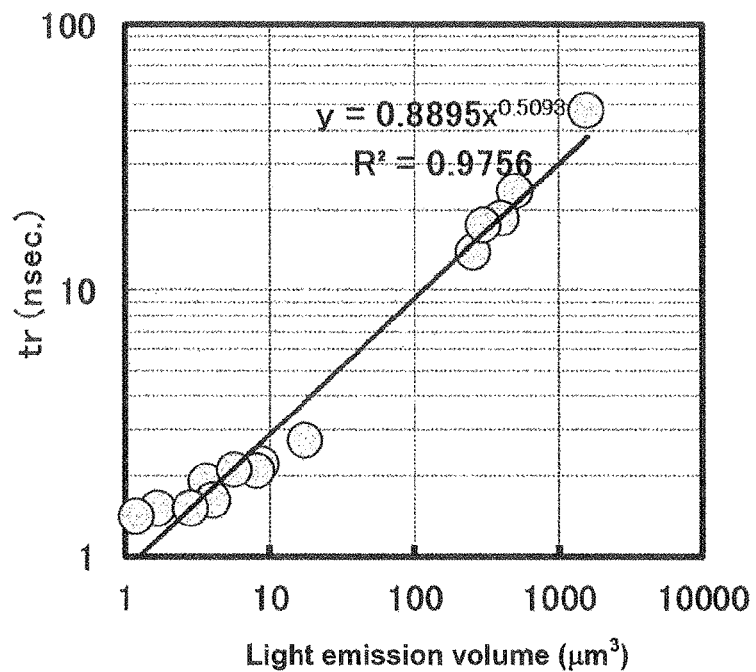
FIG. 8 is a graph showing the relationship between the light emission volume and the rise time Tr.

FIG. 8 is a graph showing the relationship between the light emission volume and the rise time Tr. The x-axis of FIG. 8 indicates the light emission volume of the semiconductor light-emitting device. The y-axis of FIG. 8 indicates the rise time Tr of the semiconductor light-emitting device.

As shown in FIG. 8, when the light emission volume is not less than 100 μm³ or more, the rise time Tr is longer than 10 nsec. When the light emission volume is not more than 14 μm³, the rise time Tr is shorter than 3 nsec.

Figure 9:
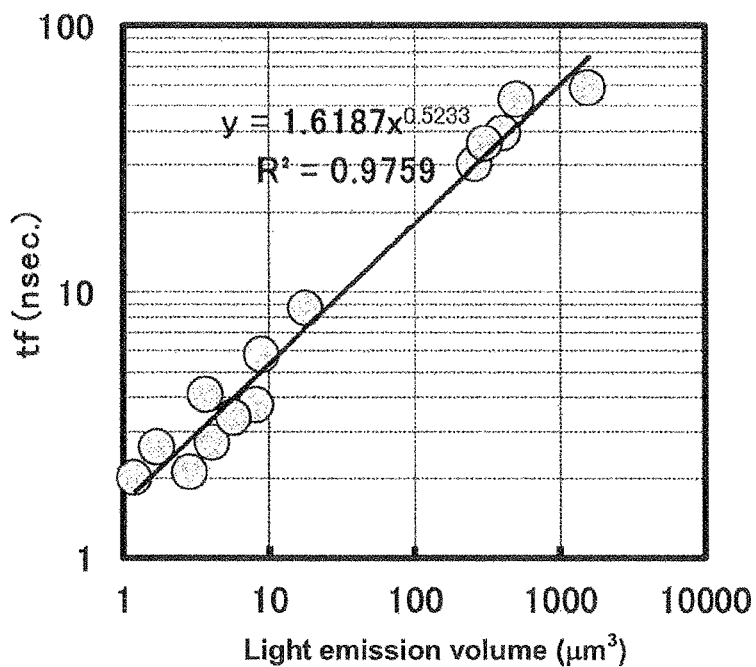
FIG. 9 is a graph showing the relationship between the light emission volume and the fall time Tf.

FIG. 9 is a graph showing the relationship between the light emission volume and the fall time Tf. The x-axis of FIG. 8 indicates the light emission volume of the semiconductor light-emitting device. The y-axis of FIG. 8 is the fall time Tf of the semiconductor light-emitting device.

As shown in FIG. 9, when the light emission volume is not less than 100 μm³, the fall time Tf is longer than 10 nsec. When the light emission volume is not more than 14 μm³, the fall time Tf is shorter than 10 nsec.

What is claimed is:

1. A light-emitting unit comprising:
a substrate made of sapphire;
an n-type layer comprising Group III nitride semiconductor;
a light-emitting layer comprising Group III nitride semiconductor;
a p-type layer comprising Group III nitride semiconductor;
an isolation groove electrically separating the n-type layer, the light-emitting layer comprising a well layer, and the p-type layer into a plurality of light-emitting devices on the substrate, wherein the n-type layer does not exist in and under the isolation groove, and a bottom of the isolation groove is a surface of the substrate;
an insulation film directly contacting with and covering the surface of the substrate which is the bottom of the isolation groove, and covering side surfaces of each light-emitting device;
an n-wiring electrode disposed on the insulation film and connecting the respective n-type layers of the respective light-emitting devices in parallel while crossing the isolation groove;
a p-wiring electrode disposed on the insulation film and connecting the respective p-type layers of the respective light-emitting devices in parallel while crossing the isolation groove;
an n-pad electrode connected to the n-wiring electrode; and
a p-pad electrode connected to the p-wiring electrode;
wherein each of the light-emitting devices has a light emission volume of 1 μm³ to 14 μm³, the light emission volume being defined as a total volume of the well layer effectively contributing to emit a light.

2. The light-emitting unit according to claim 1, wherein each of the light-emitting devices has a light emission volume of 1 μm³ to 10 μm³.

3. The light-emitting unit according to claim 1, wherein each of the light-emitting devices has a light emission volume of 1.2 μm³ to 8.9 μm³.

4. The light-emitting unit according to claim 1, wherein each of the light-emitting devices has an effective light emission area of 1000 μm² to 2400 μm².

5. The light-emitting unit according to claim 3, wherein each of the light-emitting devices has an effective light emission area of 1000 μm² to 2400 μm².

6. The light-emitting unit according to claim 1, wherein each of the light-emitting devices has the well layer with a thickness of 1 nm to 10 nm.

7. The light-emitting unit according to claim 3, wherein each of the light-emitting devices has the well layer with a thickness of 1.2 nm to 3.7 nm.

8. The light-emitting unit according to claim 4, wherein each of the light-emitting devices has the well layer with a thickness of 1.2 nm to 3.7 nm.

9. The light-emitting unit according to claim 5, wherein each of the light-emitting devices has the well layer with a thickness of 1.2 nm to 3.7 nm.

10. The light-emitting unit according to claim 1, wherein the substrate has a rectangular shape, a number of the light-emitting devices is four, and the n-pad electrode and the p-pad electrode are disposed on a diagonal line of the rectangular shape.

11. The light-emitting unit according to claim 3,
wherein the substrate has a rectangular shape, a number of the light-emitting devices is four and the n-pad electrode and the p-pad electrode are disposed on a diagonal line of the rectangular shape.

12. The light-emitting unit according to claim 4,
wherein the substrate has a rectangular shape, a number of the light-emitting devices is four and the n-pad electrode and the p-pad electrode are disposed on a diagonal line of the rectangular shape.

13. The light-emitting unit according to claim 5,
wherein the substrate has a rectangular shape, a number of the light-emitting devices is four and the n-pad electrode and the p-pad electrode are disposed on a diagonal line of the rectangular shape.

14. The light-emitting unit according to claim 9,
wherein the substrate has a rectangular shape, a number of the light-emitting devices is four and the n-pad electrode and the p-pad electrode are disposed on a diagonal line of the rectangular shape.

15. The light-emitting unit according to claim 14,
wherein the well layer of each of the light-emitting devices is a single.

* * * * *